United States Patent
Koyama et al.

(10) Patent No.: US 7,410,409 B1
(45) Date of Patent: Aug. 12, 2008

(54) ABRASIVE COMPOUND FOR CMP, METHOD FOR POLISHING SUBSTRATE AND METHOD FOR MANUFACTURING SEMICONDUCTOR DEVICE USING THE SAME, AND ADDITIVE FOR CMP ABRASIVE COMPOUND

(75) Inventors: Naoyuki Koyama, Tsukuba (JP); Kouji Haga, Hitachi (JP); Masato Yoshida, Tsukuba (JP); Keizou Hirai, Hitachiota (JP); Toranosuke Ashizawa, Hitachinaka (JP); Youiti Machii, Tsuchiura (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 247 days.

(21) Appl. No.: 10/018,188

(22) PCT Filed: Jun. 15, 2000

(86) PCT No.: PCT/JP00/03891

§ 371 (c)(1),
(2), (4) Date: Dec. 18, 2001

(87) PCT Pub. No.: WO00/79577

PCT Pub. Date: Dec. 28, 2000

(30) Foreign Application Priority Data

Jun. 18, 1999 (JP) ................................. 11/172821
Jul. 19, 1999 (JP) ................................. 11/204842
Nov. 24, 1999 (JP) ................................. 11/332221

(51) Int. Cl.
*B24B 1/00* (2006.01)

(52) U.S. Cl. .......................... 451/36; 438/693; 451/41; 451/59; 451/63

(58) Field of Classification Search ................... 216/88, 216/89, 90; 438/691, 692, 693; 451/36, 451/41, 59, 63
See application file for complete search history.

(56) References Cited

U.S. PATENT DOCUMENTS

| 4,222,747 A | 9/1980 | Dauguet et al. |
| 6,248,143 B1 * | 6/2001 | Masuda et al. ................. 51/307 |
| 6,420,269 B2 * | 7/2002 | Matsuzawa et al. ......... 438/693 |
| 2003/0181046 A1 * | 9/2003 | Sachan et al. ............... 438/690 |

FOREIGN PATENT DOCUMENTS

| EP | 0 373 501 | 6/1990 |
| EP | 0 820 092 | 1/1998 |
| EP | 0 846 740 | 6/1998 |
| JP | 410102040 A * | 4/1998 |
| WO | WO 99/64527 | 12/1999 |

OTHER PUBLICATIONS

Supplementary European Search Report, for Application No. EP 00 93 7240, dated Oct. 24, 2002.

* cited by examiner

*Primary Examiner*—Timothy V Eley
(74) *Attorney, Agent, or Firm*—Antonelli, Terry, Stout & Kraus, LLP.

(57) ABSTRACT

The present invention discloses a CMP abrasive comprising cerium oxide particles, a dispersant, an organic polymer having an atom or a structure capable of forming a hydrogen bond with a hydroxyl group present on a surface of a film to be polished and water, a method for polishing a substrate comprising polishing a film to be polished by moving a substrate on which the film to be polished is formed and a polishing platen while pressing the substrate against the polishing platen and a polishing cloth and supplying the CMP abrasive between the film to be polished and the polishing cloth, a method for manufacturing a semiconductor device comprising the steps of the above-mentioned polishing method, and an additive for a CMP abrasive comprising an organic polymer having an atom or a structure capable of forming a hydrogen bond with a hydroxyl group present on a surface of a film to be polished, and water.

19 Claims, No Drawings

ABRASIVE COMPOUND FOR CMP, METHOD FOR POLISHING SUBSTRATE AND METHOD FOR MANUFACTURING SEMICONDUCTOR DEVICE USING THE SAME, AND ADDITIVE FOR CMP ABRASIVE COMPOUND

TECHNICAL FIELD

The present invention relates to a CMP (Chemical Mechanical Polishing) abrasive used in a step for smoothing a surface of a substrate, particularly in a step for smoothing an interlayer insulating film and a BPSG (a boron phosphorus-doped silicon dioxide film) film, a step for forming shallow trench isolation or the like which are semiconductor element manufacturing techniques, a method for polishing a substrate and a method for manufacturing a semiconductor device using this CMP abrasive, and an additive for a CMP abrasive.

BACKGROUND ART

Current ultra large scale integrated circuits tend to enhance packaging density, and various microscopic processing technologies have been studied and developed. Thus, the design-rule has reached a sub half micron order. One of the technologies which have been developed to satisfy requirements for such severe fining is a CMP technology. This CMP technology can fully smooth a layer to be exposed, reduce the load of an exposure technology, and stabilize the yield in steps for manufacturing semi-conductor devices. Thus, the CMP technology is an essential technology for smoothing an interlayer insulating film and a BPSG film, and performing shallow trench isolation, for example.

In steps for manufacturing semiconductor devices, as a CMP abrasive for smoothing inorganic insulating films such as silicon oxide insulating films formed by a plasma-CVD (Chemical Vapor Deposition) method, a low pressure-CVD method or the like, fumed silica series abrasives have been generally studied. The fumed silica series abrasives are produced by causing grain growth by a process of subjecting to pyrolysis of silica particles into silicic tetrachloride or the like and by performing pH adjustment. However, such an abrasive incurs technical problems that the polishing speed for inorganic insulating films is not sufficient, causing a low polishing speed in practical use.

In a conventional CMP technology for smoothing an interlayer insulating film, there are technical problems that high level smoothing cannot be realized in the entire surface of a wafer since the dependency of polishing speed on the pattern of a film to be polished on a substrate is great, the polishing speeds in projected portions are largely differentiated due to the magnitude of the pattern density difference or the size difference, and the polishing of even recessed portions proceeds.

Further, in the CMP technology for smoothing the interlayer film, it is necessary to finish polishing in the middle of the interlayer film, and a method for controlling a process of controlling the amount of polishing by polishing time has been generally carried out. However, since the polishing speed is remarkably changed not only due to the change in shapes of pattern steps, but also due to the conditions of polishing cloth and the like, there is the problem that process management is difficult.

LOCOS (Local Oxidation of Silicon) had been used for element isolation in integrated circuits in the generation of a 0.5 μm or more design-rule. As the working size becomes finer thereafter, technologies of narrower width of element isolation have been required and shallow trench isolation is being used. In the shallow trench isolation, the CMP is used for removing excess silicon oxide films formed on a substrate and a stopper film having a slow polishing speed is formed beneath the silicon oxide film to stop the polishing. As a stopper film, silicon nitride and the like are used, and preferably, the ratio of the polishing speed between the silicon oxide film and the stopper film is large. Conventional fumed silica series abrasives have a polishing speed ratio of as small as about 3 between the above-mentioned silicon oxide film and the stopper film, and the fumed silica abrasives have a problem that they do not have properties endurable for practical use for shallow trench isolation.

On the other hand, as the glass-surface abrasive for photomasks, lenses, and the like, a cerium oxide abrasive has been used. As cerium oxide particles have lower hardness than silica particles or alumina particles, they tend to cause few scratches on a surface to be polished so that they are useful for finishing mirror polishing. However, since the cerium oxide abrasive for glass surface polishing uses a dispersant containing a sodium salt, it cannot be applied to an abrasive for semiconductors as it is.

An object of the present invention is to provide a CMP abrasive which is capable of polishing a surface to be polished such as a silicon oxide insulating film at high speed without causing scratches while attaining high level smoothing and has a high storage stability.

Another object of the present invention is to provide a method for polishing a substrate which is capable of polishing a surface to be polished of a substrate at high speed without causing scratches while attaining high level smoothing with easy process control.

A further object of the present invention is to provide a method for manufacturing a semiconductor device which is capable of manufacturing a semiconductor device having a high reliability with high productivity and good yield. A still further object of the present invention is to provide an additive for a CMP abrasive, which CMP abrasive is capable of polishing a surface to be polished at high speed without causing scratches while attaining high level smoothing, and particularly capable of providing the CMP abrasive with an excellent storage stability.

DISCLOSURE OF THE INVENTION

The present invention relates to a CMP abrasive comprising cerium oxide particles, a dispersant, an organic polymer having an atom or a structure capable of forming a hydrogen bond with a hydroxyl group present on a surface of the film to be polished, and water.

Further, the present invention relates to the CMP abrasive in which the organic polymer is a compound containing at least one atom having an unpaired electron in the molecular structure.

Further, the present invention relates to the CMP abrasive in which the organic polymer is a compound containing either one or both of a nitrogen atom and an oxygen atom in the molecular structure.

Further, the present invention relates to the CMP abrasive in which the organic polymer is a compound having an adsorption ratio of 50% or more with respect to silicon oxide particles of a specific surface area of 50 $m^2/g$ dispersed in water of pH 6 to 8.

Further, the present invention relates to the CMP abrasive in which the organic polymer is a compound having an adsorption ratio of 40% or more with respect to silicon nitride particles of a specific surface area of 3.3 $m^2/g$ dispersed in water of pH 6 to 8.

Further, the present invention relates to the CMP abrasive in which the sedimentation speed for cerium oxide particles is 20 μm/s or less.

The present invention also relates to the CMP abrasive in which the organic polymer is polyvinyl pyrrolidone.

Further, the present invention relates to a method for polishing a substrate comprising polishing a film to be polished by moving a substrate on which the film to be polished was formed and a polishing platen while pressing the substrate against the polishing platen and a polishing cloth and supplying the CMP abrasive between the film to be polished and the polishing cloth.

Further, the present invention relates to a method for manufacturing a semiconductor device comprising a step of polishing a film to be polished by moving a substrate on which the film to be polished is formed and a polishing platen while pressing the substrate against the polishing platen and a polishing cloth and supplying the CMP abrasive between the film to be polished and the polishing cloth.

Further, the present invention relates to an additive for a CMP abrasive comprising an organic polymer having an atom or a structure capable of forming a hydrogen bond with a hydroxyl group present on a surface of a film to be polished, and water.

BEST MODE FOR CARRYING OUT THE INVENTION

Cerium oxide particles in the present invention are obtained by oxidizing cerium salts such as carbonate of cerium, nitrate of cerium, sulfate of cerium and oxalate of cerium. The cerium oxide particles preferably have a crystalline diameter of 5 to 300 nm from the viewpoints of high speed polishing and low scratch properties.

In the present invention, as methods for preparing cerium oxide, calcination or an oxidation method of using hydrogen peroxide, etc., can be used. Preferably, the calcining temperature is 350° C. or higher and 900° C. or lower.

Since the cerium oxide particles manufactured by the above method are agglomerated, it is preferred to mechanically grind them. The grinding methods preferably include a dry grinding method with a jet mill or the like and a wet grinding method with a planetary bead mill or the like. The jet mill is described in, for example, the Chemical Industry Theses, Vol. 6, No. 5 (1980) pp. 527 to 532.

The CMP abrasive according to the present invention can be manufactured by first preparing a dispersion of cerium oxide particles (hereinafter sometimes referred to as a "slurry") comprising cerium oxide particles, a dispersant and water, and adding an organic polymer having an atom or a structure capable of forming a hydrogen bond with a hydroxyl group present on a surface of a film to be polished (hereinafter sometimes referred to as merely "organic polymer") therein. Here, the concentration of the cerium oxide particles is not limited, but it is preferably in the range of from 0.5 to 20% by weight from the viewpoint of handling of the dispersion.

As the dispersants, there may be mentioned a water-soluble anionic dispersant, a water-soluble nonionic dispersant, a water-soluble cationic dispersant, and a water-soluble amphoteric dispersant.

As the above-mentioned water-soluble anionic dispersants, there may be mentioned, for example, lauryl sulfate triethanolamine, lauryl sulfate ammonium, polyoxyethylene alkyl ether sulfate triethanolamine and polycarboxylic acid series polymer (for example, an alkali metal salt or ammonium salt of a (co) polymer comprising (meth)acrylic acid, alkyl (meth)acrylate used depending on necessity and vinyl monomer used depending on necessity). Here, the (meth) acrylic acid in the present invention means an acrylic acid and a methacrylic acid corresponding thereto, and the alkyl (meth)acrylate means an alkyl acrylate and an alkyl methacrylate corresponding thereto.

As the above-mentioned water-soluble nonionic dispersants, there may be mentioned, for example, polyoxyethylene lauryl ether, polyoxyethylene cetyl ether, polyoxyethylene stearyl ether, polyoxyethylene oleyl ether, polyoxyethylene higher alcohol ether, polyoxyethylene octyl phenyl ether, polyoxyethylene nonyl phenyl ether, polyoxyalkylene alkyl ether, polyoxyethylene derivative, polyoxy-ethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, tetraoleic acid polyoxyethylene sorbitol, polyethylene glycol monolaurate, polyethylene glycol monostearate, polyethylene glycol distearate, polyethylene glycol monooleate, polyoxyethylene alkylamine, polyoxyethylene hardened castor oil, and alkyl alkanolamide, etc.

As the above-mentioned water-soluble cationic dispersants, there may be mentioned, for example, coconut amine acetate and stearylamine acetate, etc.

Further, as the above-mentioned water-soluble amphoteric dispersants, there may be mentioned, for example, lauryl betaine, stearyl betaine, lauryldimethyl amine oxide, and 2-alkyl-N-carboxymethyl-N-hydroxyethyl imidazolinium betaine, etc.

It is preferred that the amount of these dispersants to be added is in the range of 0.01 part by weight or more and 2.0 parts by weight or less based on 100 parts by weight of cerium oxide particles from the viewpoint of improvement of dispersibility or prevention of sedimentation of cerium oxide particles in a slurry, and prevention of polishing scratches, and the like. The weight average molecular weight (a value obtained by measuring with GPC and calculated in terms of standard polystyrene) is preferably 100 to 50,000, more preferably 1,000 to 10,000. When the molecular weight of the dispersant is less than 100, sufficient polishing speed cannot be obtained in polishing a silicon oxide film or a silicon nitride film, and when the molecular weight of the dispersant exceeds 50,000, the viscosity thereof becomes high and the storage stability of a CMP abrasive tends to be lowered.

In the methods of dispersing these cerium oxide particles into water, in addition to the dispersion processing using a usual stirrer, a homogenizer, an ultrasonic dispersing machine, a wet type ball mill and the like can be used.

The average particle diameter of the thus prepared cerium oxide particles in a slurry is preferably 0.01 μm to 1.0 μm. When the average particle diameter of the cerium oxide particles is less than 0.01 μm, the polishing speed tends to become low, and when the average particle diameter thereof exceeds 1.0 μm, the abrasive tends to cause scratches on a film to be polished.

Although organic polymers having an atom or a structure capable of forming a hydrogen bond with a hydroxyl group present on a surface of a film to be polished are not particularly limited as long as they have a defined particular atom or structure, there may be mentioned, for example, a compound containing at least one atom having an unpaired electron in the molecular-structure, or a compound containing either one or both of a nitrogen atom and an oxygen atom in the molecular structure.

Specifically, there may be mentioned polyvinyl acetal, polyvinyl formal, polyvinyl butyral, polyvinyl pyrrolidone, polyvinyl pyrrolidone-iodine complex, polyvinyl (5-methyl- 2-pyrrolidinone), polyvinyl (2-piperidinone), polyvinyl (3,3, 5-trimethyl-2-pyrrolidinone), poly(N-vinylcarbazole), poly (N-alkyl-2-vinylcarbazole), poly(N-alkyl-3-vinyl-carbazole), poly(N-alkyl-4-vinylcarbazole), poly(N-vinyl-3, 6-dibromocarbazole), polyvinyl phenyl ketone, polyvinyl acetophenone, poly(4-vinylpyridine), poly(4-$\beta$-hydroxy-ethylpyridine), poly(2-vinylpyridine), poly(2-$\beta$-hydroxy-ethylpyridine, poly(4-vinylpyridinium salt), poly($\alpha$-methyl-styrene-co-4-vinyl pyridinium hydrochloride), poly-(potassium 1-(3-sulfonyl)-2-vinylpyridinium betaine-co-p-styrene sulfonate), poly(N-vinylimidazole), poly(4-vinyl imidazole), poly(5-vinyl imidazole), poly(1-vinyl-4-methyl-oxazolidinone), polyvinyl acetamide, polyvinyl methyl acetamide, polyvinyl ethyl acetamide, polyvinyl phenyl acetamide, polyvinyl methyl propionamide, polyvinyl ethyl propionamide, polyvinyl methyl isobutylamide, polyvinyl methyl benzylamide, poly(meth)acrylic acid, poly(meth)-acrylic acid derivatives, poly(meth)acrylic acid ammonium salts, polyvinyl alcohol, polyvinyl alcohol derivatives, polyacrolein, polyacrylonitrile, polyvinyl acetate, poly(vinyl acetate-co-methyl methacrylate), poly(vinyl acetate-co-vinyl acrylate), poly(vinyl acetate-co-pyrrolidine), poly(vinyl acetate-co-acetonitrile), poly(vinyl acetate-co-N,N-diallyl cyanide), poly (vinyl acetate-co-N,N-diallyl amine), and poly(vinyl acetate-co-ethylene), etc. Among these polymers, polyvinyl pyrrolidone, poly(meth)acrylic acid derivative, and poly(meth)-acrylic acid ammonium salts are preferable, and polyvinyl pyrrolidone is particularly preferable.

The organic polymer is preferably a compound having an adsorption ratio of 50% or more with respect to silicon oxide particles dispersed in water of pH 6 to 8 and having a specific surface area of 50 m$^2$/g, from the viewpoint of performing excellent polishing for shallow trench isola-tion. Further, from the same viewpoint, it is preferably a compound having an adsorption ratio of 40% or more to silicon nitride particles having a specific surface area of 3.3 m$^2$/g dispersed in water of pH 6 to 8.

The amount of these organic polymers to be added is preferably in a range of 0.01 part by weight to 100 parts by weight, more preferably 0.1 part by weight to 50 parts by weight, and most preferably 1 part by weight to 50 parts by weight, based on 100 parts by weight of cerium oxide particles from the viewpoint of improvement in dispersibility of the cerium oxide particles in CMP abrasive, prevention of sedimentation and prevention of polishing scratches. Further, the weight average molecular weight of the organic polymer (a value obtained by measuring with a GPC and calculated in terms of standard polystyrene) is preferably 5,000 to 2,000,000, and more preferably 10,000 to 1,200,000.

In the present invention, a cerium oxide slurry comprising cerium oxide particles, a dispersant, and water, and an additive for a CMP abrasive comprising an organic polymer and water may be divided, and may be stored and utilized as a two-liquid type CMP abrasive.

When a substrate is polished by the above-mentioned CMP abrasive, there can be employed a method having steps of separately supplying the slurry and additive onto a polishing platen, and mixing them thereon, a method having steps of mixing the slurry and additive just before polishing and supplying the mixture onto a polishing platen, etc.

To the CMP abrasive according to the present invention, additives such as N,N-dimethylethanolamine, N,N-diethylethanolamine, aminoethylethanolamine and the like may be added.

In the CMP abrasive of the present invention, the sedimentation speed of the cerium oxide particles is preferably 20 µm/s or less from the viewpoint of workability.

An inorganic insulating film which is one of films to be polished using a CMP abrasive of the present invention is formed by a low-pressure CVD method, a plasma CVD method or the like.

Formation of a silicon oxide film by the low-pressure CVD method uses monosilane: $SiH_4$ as an Si source, and oxygen: $O_2$ as an oxygen source. A silicon oxide film can be obtained by performing this $SiH_4$—$O_2$ series oxidation reaction at a low temperature of 400° C. or lower. Heat treatment is optionally performed at a temperature of 1,000° C. or lower after the CVD process. When phosphorus: P is doped to attain the surface smoothness by a high-temperature reflow process, an $SiH_4$—$O_2$—$PH_3$ series reaction gas is preferably used.

The plasma CVD method has such an advantage that a chemical reaction, which requires a high temperature under usual thermal equilibrium, can be performed at a low temperature. The plasma generation method includes two types: a volume connection type and an induction connection type. The reaction gases include an $SiH_4$—$N_2O$ series gas using $SiH_4$ as an Si source and $N_2O$ as an oxygen source, and TEOS-$O_2$ series gas (TEOS-plasma CVD method) using tetra-ethoxysilane (TEOS) as an Si source. The temperature of a substrate is preferably in a range of 250° C. to 400° C., and the reaction pressure is preferably in a range of 67 to 400 Pa. Thus, to the silicon oxide film of the present invention, elements such as phosphorus and boron may be doped.

Similarly, formation of silicon nitride film by the low-pressure CVD method uses dichlorosilane: $SiH_2Cl_2$ as an Si source and ammonia: $NH_3$ as a nitrogen source. A silicon nitride film can be obtained by performing this $SiH_2Cl_2$—$NH_3$ series oxidation reaction at a high temperature of 900° C.

In the plasma CVD method, the reaction gases include an $SiH_4$—$NH_3$ series gas using $SiH_4$ as an Si source and $NH_3$ as a nitrogen source. The temperature of a substrate is preferably 300° C. to 400° C.

As a substrate, a semiconductor substrate, that is a semiconductor substrate in a phase of circuit elements and a wiring pattern formed thereon, or circuit elements formed thereon and the like on which a silicon oxide film layer or a silicon nitride film layer is formed can be used. By polishing the silicon oxide film or silicon nitride film formed on such a semiconductor substrate with a CMP abrasive, the projections and recessions of a surface of the silicon oxide film layer are removed and a smooth surface over the entire surface of the semiconductor substrate can be obtained.

Further, it can be also used for shallow trench isolation. To use it for shallow trench isolation, the ratio between the silicon oxide film polishing speed and the silicon nitride film polishing speed, that is the silicon oxide film polishing speed/ the silicon nitride film polishing speed is preferably 10 or more. In the case where this ratio is less than 10, the difference between the silicon oxide film polishing speed and the silicon nitride film polishing speed is small, and stopping the polishing at a predetermined position tends to become difficult in the shallow trench isolation. In the case where this ratio is 10 or more, the silicon nitride film polishing speed is further reduced, rendering stoppage of polishing easy, thus making it more suitable for shallow trench isolation.

To use the CMP abrasive for the shallow trench isolation, it is preferred that generation of scratches during polishing be small.

Here, as a polishing device, a general polishing device having a holder which supports a semiconductor substrate, and a platen to which a polishing cloth (pad) is adhered (a motor whose number of revolutions is changeable is attached) can be used.

As a polishing cloth, a general nonwoven fabric, an expanded polyurethane, a porous fluorine resin or the like can be used without specific limitation. Further, it is preferred that a groove in which the CMP abrasive is stored be formed in the polishing cloth.

Although the polishing conditions are not limited, the rotational speed of the platen is preferably low as 200 min$^{-1}$ or less so that the semiconductor substrate does not come off, and the pressure applied to the semiconductor substrate is preferably 10$^5$ Pa or less so that no scratches will be present after polishing.

During polishing, a slurry is continuously supplied onto a polishing cloth with a pump or the like. Although the amount of a slurry supplied is not limited, it is preferred that the surface of the polishing cloth be always covered with a slurry.

It is preferred that after the polished semiconductor substrate is washed well in running water, water drops attached onto the semiconductor substrate be shaken off with a spin dryer or the like and dried.

Thus, after the smoothed shallow trench is formed, an aluminum wiring is formed on a silicon oxide insulating film layer, and a silicon oxide insulating film is formed between the wirings and on the wiring by the above-mentioned process again, then polishing is performed using the CMP abrasive so that the projections and recessions on a surface of the insulating film are removed to form a smooth surface over the entire surface of the semiconductor substrate. By repeating these steps for predetermined times, a semiconductor having a desired number of layers is manufactured.

The CMP abrasive according to the present invention can polish not only a silicon oxide film formed on a semiconductor substrate, but also a silicon oxide film formed on a wiring board having predetermined wiring, an inorganic insulating film such as glass, silicon nitride, etc., a film principally containing polysilicon, Al, Cu, Ti, TiN, W, Ta, TaN and the like, an optical glass such as a photomask, a lens, and a prism, an inorganic conducting film such as ITO, an optical integrated circuit, an optical switching element, an optical waveguide constituted by glass and a crystalline material, an end surface of optical fiber, an optical single crystal such as a scintillator, a solid laser single crystal, a sapphire substrate for a blue laser LED, a semiconductor single crystal such as SiC, GaP and GaAs, a glass substrate for a magnetic disk, a magnetic head and the like.

EXAMPLE

The present invention will be described below in detail using Examples, but the present invention is not limited thereto.

Example 1

Preparation of Cerium Oxide Particles 2 kg of a cerium carbonate hydrate was placed into a vessel made of alumina, and calcined at a temperature of 800° C. for 2 hours in the air to obtain about 1 kg of yellowish white powder. This powder was phase-identified by the X-ray diffractometry whereby it was confirmed to be cerium oxide. The diameter of the calcined powder particles was 30 to 100 μm. The surface of the calcined powder particle was observed with a scanning type electron microscope, and then particle boundaries of the cerium oxide were observed. A primary particle diameter of a cerium oxide surrounded by the grain boundary was measured. The median value and the maximum value in the volume distribution were 190 nm and 500 nm, respectively.

1 kg of cerium oxide powder was dry-ground with a jet mill. The observation of the ground particles was performed with a scanning type electron microscope. As a result, not only small particles having the same size as the primary particle diameter, but also remaining not-ground large particles of 1 to 3 μm and remaining not-ground particles of 0.5 to 1 μm were found to be mixed with each other.

(Measurement of Adsorption of Organic Polymer to Silicon Oxide Particles)

100 g of a testing water having a concentration of 500 ppm polyvinyl pyrrolidone with a weight average molecular weight of 25,000 was adjusted to pH 7.0, and 50 g of the testing water was measured and taken out. Then, 0.5 g of silicon oxide particles having a specific surface area of 50 m$^2$/g were added to the water and shaken reciprocally for 10 minutes. After that, centrifugal separation was conducted at 15,000 min$^{-1}$, for 5 minutes to obtain a supernatant liquid. Subsequently, the total amount of organic carbon (TOC) in this supernatant (liquid A) and that of the remaining testing water (liquid B) not mixed with silicon oxide particles were measured respectively with a total organic carbon meter TOC-5000 manufactured by Shimadzu Corp. The measurement of TOC was determined by subtracting the amount of the inorganic carbon (IC) from the total amount of carbon (TC).

Further, silica particles were similarly mixed with pure water and shaken, and after centrifugal separation, the TOC value of the supernatant was set to a blank value. The TOC values of the liquids A and B were defined as TOCA and TOCB, respectively, and the adsorbed amount was calculated by the expression of (TOCB−TOCA/TOCA). As a result, the adsorbed amount of polypyrrolidone to the silicon oxide particles was 78%.

(Adsorption of Organic Polymer to Silicon Nitride Particles)

100 g of testing water having a concentration of 50 ppm polyvinyl pyrrolidone with a weight average molecular weight of 25,000 was adjusted to pH 7.0, and 50 g of the testing water was measured and taken out. Then, 4 g of silicon oxide particles having a specific surface area of 3.3 m$^2$/g were added to the water and shaken reciprocally for 10 minutes. After that, centrifugal separation was conducted at 15,000 min$^{-1}$ for 5 minutes to obtain a supernatant. Subsequently, the total amount of organic carbon (TOC) in the supernatant (liquid C) and that of the remaining testing water (liquid D) not mixed with silicon oxide particles were measured, respectively, with a total organic carbon meter TOC-5000 manufactured by Shimadzu Corp. The measurement of TOC was determined by subtracting the amount of inorganic carbon (IC) from the total amount of carbon (TC).

Further, silica particles were similarly mixed with pure water and shaken, and after centrifugal separation, the TOC value of the supernatant was set to a blank value. The TOC values of the liquids C and D were defined as TOCC and TOCD respectively, and the adsorbed amount was calculated by an expression of (TOCD−TOCC/TOCD). As a result, the adsorbed amount of polyvinyl pyrrolidone to the silicon oxide particles was 53%.

(Preparation of Cerium Oxide Slurry)

1 kg of the above-prepared cerium oxide particles, 23 g of an aqueous ammonium polyacrylate solution (40% by weight) and 8,977 g of deionized water were mixed and ultrasonic dispersion was performed for 10 minutes while stirring. The obtained slurry was filtered with a 1 micron filter, and a slurry (solid content: 5% by weight) was obtained by further adding deionized water. The pH of this slurry was 8.3. To measure the slurry particles with a laser diffraction type grain size distribution meter, the particles were diluted to an appropriate concentration. As a result, the median value of the particle diameters was 190 nm.

Further, 600 g of the cerium oxide slurry (solid content: 5% by weight), 3 g of polyvinyl pyrrolidone with a weight average molecular weight of 25,000 as an additive and 2,397 g of deionized water were mixed to prepare a CMP abrasive (solid content: 1% by weight). The pH of this CMP abrasive was 8.0. To measure the particles in the CMP abrasive with a laser diffraction type grain size distribution meter, the particles were diluted to an appropriate concentration. As a result, the median value of the particle diameters was 190 nm.

(Measurement of Sedimentation Speed)

500 g of the cerium oxide slurry prepared in the above section "preparation of cerium oxide slurry" was placed into an Andreasen pippette and left to stand. Immediately after the operation, 10 ml of slurry was sampled from a position of 20 cm below the surface of the cerium oxide slurry, and the concentration thereof was measured.

The same operation was performed after 3 hours, 6 hours, 24 hours, 2 days, 5 days, 8 days, 13 days, 20 days, 30 days, 70 days and 120 days.

As a result, the average sedimentation speed of the cerium oxide slurry was 0.11 μm/s.

Here, the average sedimentation speed means a value obtained by dividing 20 cm by the time required for the concentration measured in the above-mentioned manner to reduce into the half of the initial 5% by weight, or 2.5% by weight.

The time required at this time was 21 days. Further, a concentration measured after 6 days was 5% by weight, which was not changed. Thus, the maximum sedimentation speed of this cerium oxide slurry is 9 μm/s or less. That is, the sedimentation speed of all the cerium oxide particles contained in this cerium oxide slurry is 9 μm/s or less.

(Polishing of Insulating Film Layer)

After an Al wiring line portion having a line/space width of 0.05 to 5 mm and a height of 1,000 nm was formed on an Si substrate having a diameter of 200 mm, a pattern wafer on which a 2,000 nm thick silicon oxide film was formed by the TEOS-plasma CVD method was prepared.

The above-mentioned pattern wafer was set on a holder to which an adsorption pad for mounting a substrate to be held was adhered, and the holder was placed on a platen having a diameter of 600 mm, to which a polishing pad made of a porous urethane resin was adhered with the insulating film surface down, and then the working load was set to 30 kPa.

The platen and the wafer were rotated for 2 minutes at a rotational speed of 50 min$^{-1}$ while dropping the above-mentioned cerium oxide abrasive (solid content: 1% by weight) on the platen at a dropping speed of 200 ml/min, thereby polishing the insulating film.

After the polished wafer was washed well with pure water, it was dried. Similarly, the above-mentioned pattern wafers were polished for polishing-time of 3 minutes, 4 minutes, 5 minutes and 6 minutes.

Using an optical interference type film thickness measuring device, the thickness difference before and after polishing were measured and the polishing speed was calculated.

Polishing speed of a line portion having a line/space width of 1 mm is defined as $R_1$, the polishing speed of a line portion having a line/space width of 3 mm as $R_3$, and the polishing speed of a line portion having a line/space width of 5 mm as $R_5$. The polishing speed ratios $R_5/R_1$ and $R_3/R_1$ became larger for polishing time between polishing time of 2 and 4 minutes according to the increase in the polishing time, and became substantially constant between polishing time of 4 and 6 minutes.

In the case of 4 minutes polishing time where the pattern width dependency of the polishing speed becomes constant, the polishing speed $R_1$ for a line portion having a line/space width of 1 mm was 344 nm/min (amount of polishing: 1,377 nm), the polishing speed $R_3$ for a line portion having a line/space width of 3 mm was 335 nm/min (amount of polishing: 1,338 nm), and the polishing speed $R_5$ for a line portion having a line/space width of 5 mm was 315 nm/min (amount of polishing: 1,259 nm), and the polishing speed ratios $R_5/R_1$ and $R_3/R_1$ were 0.91 and 0.97, respectively.

The amounts of polishing of line portions in each line/space width for the polishing time of 5 minutes and 6 minutes were substantially the same as in the case of 4 minutes, and it was found that no polishing advanced at all after 4 minutes.

Example 2

Preparation of Cerium Oxide Particles 2 kg of cerium carbonate hydrate was placed into a vessel made of platinum, and calcined at a temperature of 800° C. for 2 hours in the air to obtain about 1 kg of yellowish white powder. This powder was phase-identified by the X-ray diffractometry, whereby the powder was confirmed to be cerium oxide. The diameters of the calcined powder particles were 30 to 100 μm. The surface of the calcined powder particles was observed with a scanning type electron microscope, and particle boundaries of the cerium oxide were observed. A primary particle diameter of a cerium oxide particle surrounded by the grain boundary was measured. The median value and the maximum value in the volume distribution were 190 nm and 500 nm, respectively.

1 kg of cerium oxide powder was dry-ground with a jet mill. The observation of the ground particles was performed with a scanning type electron microscope. As a result, not only small particles having the same size as the primary particle diameter, but also remaining not-ground large particles of 1 to 3 μm and remaining not-ground particles of 0.5 to 1 μm were found to be mixed with each other.

(Preparation of Cerium Oxide Slurry)

1 kg of the prepared cerium oxide particles, 23 g of an aqueous ammonium polyacrylate solution (40% by weight) and 8,977 g of deionized water were mixed and ultrasonic dispersion was performed for 10 minutes while stirring. The obtained slurry was filtered with a 1 micron filter, and a slurry (solid content: 5% by weight) was obtained by adding deionized water. The pH of this slurry was 8.3. To measure the slurry particles with a laser diffraction type grain size distribution meter, the particles were diluted to an appropriate concentration. As a result, the median value of the particle diameters was 190 nm.

Further, 600 g of the cerium oxide slurry (solid content: 5% by weight), 3 g of polyvinyl pyrrolidone as an additive and 2,397 g of deionized water were mixed to prepare a CMP abrasive (solid content: 1% by weight). The pH of this CMP abrasive was 8.0. To measure the particles in the CMP abrasive with a laser diffraction type grain size distribution meter, the particles were diluted to an appropriate concentration. As a result, the median value of the particle diameters was 190 nm.

(Polishing of Shallow Trench Separation Layer)

Projected portions each having a square section of a side of 350 nm to 0.1 mm and recessed portions each having a depth of 400 nm were formed on an Si substrate having a diameter of 200 mm, and a pattern wafer having the projected portion density of 2 to 40% was prepared.

A 100 nm thick nitrogen oxide film was formed on the projected portions and a 500 nm thick silicon oxide film was formed thereon by the TEOS-plasma CVD method.

The above-mentioned pattern wafer was set on a holder to which an adsorption pad for mounting a substrate to be held was adhered, and the holder was placed on a platen having a diameter of 600 mm to which a polishing pad made of a porous urethane resin was adhered with the insulating film surface down, and further the working load was set to 30 kPa.

The platen and the wafer were rotated for 4 minutes at a rotational speed of 50 $min^{-1}$ while dropping the above-mentioned CMP abrasive (solid content: 1% by weight) on the platen at a dropping speed of 200 ml/min, thereby polishing the insulating film. After the polished wafer was washed well with pure water, it was dried. Similarly, the above-mentioned pattern wafers were polished by setting the polishing time to 5 minutes and 6 minutes.

Using an optical interference type film thickness measuring device, the film thicknesses before and after polishing were measured. At the polishing time of 4 minutes, the entire silicon oxide film on the projected portions was polished, and when the nitrogen oxide film was exposed, the polishing stopped. Then the film thickness before and after polishing was measured and the polishing speed was calculated. The polishing speeds on projected portions having 0.1 mm square and densities of 40% and 2% are defined as $R_{0.1-40}$ and $R_{0.1-2}$, respectively, and the polishing speeds on projected portions having 350 nm square and densities of 40% and 2% are defined as $R_{350-40}$ and $R_{350-2}$, respectively. In the case where polishing time was set to 4 minutes, $R_{0.1-40}$, $R_{0.1-2}$, $R_{350-40}$ and $R_{350-2}$ were 126 nm/min, 135 nm/min, 133 nm/min, and 137 nm/min, and $R_{0.1-40}/R_{350-40}$ and $R_{0.1-2}/R_{350-2}$ were 0.95 and 0.99, respectively. Thus, there was no pattern width dependency. Further, the amounts of polishing in the projected portions in each pattern width in the case of polishing time of 5 minutes and 6 minutes were substantially the same as in the case of 4 minutes, and it was found that no polishing advanced at all after 4 minutes.

Comparative Example 1

Preparation of Cerium Oxide Particles 2 kg of cerium carbonate hydrate was placed into a vessel made of platinum, and calcined at a temperature of 800° C. for 2 hours in the air to obtain about 1 kg of yellowish white powder. This powder was phase-identified by an X-ray diffractometry, whereby the powder was confirmed to be cerium oxide. The diameter of the calcined powder particle was 30 to 100 μm. A surface of the calcined powder particle was observed with a scanning type electron microscope, and particle boundaries in the cerium oxide were observed. A primary particle diameter of a cerium oxide surrounded by the grain boundary was measured. The median value and the maximum value in the volume distribution were 190 nm and 500 nm, respectively.

1 kg of cerium oxide powder was dry-ground with a jet mill. The observation of the ground particles was performed with a scanning type electron microscope. As a result, not only small particles having the same size as the primary particle diameter, but also remaining not-ground large particles of 1 to 3 μm and remaining not-ground particles of 0.5 to 1 μm were found to be mixed with each other.

(Preparation of Cerium Oxide Slurry)

1 kg of the prepared cerium oxide particles, 23 g of an aqueous ammonium polyacrylate solution (40% by weight) and 8,977 g of deionized water were mixed and ultrasonic dispersion was performed for 10 minutes while stirring. The obtained slurry was filtered with a 1 micron filter, and a cerium oxide slurry (solid content: 5% by weight) was obtained by further adding deionized water. The pH of this cerium oxide slurry was 8.3.

600 g of the above-mentioned cerium oxide slurry (solid content: 5% by weight), and 2,400 g of deionized water were mixed to prepare an abrasive (solid content: 1% by weight). The pH of this abrasive was 7.4. To measure the particles in the abrasive with a laser diffraction type grain size distribution meter, the particles were diluted to an appropriate concentration. As a result, the median value of the particle diameters was 190 nm.

(Polishing of Insulating Film)

After an Al wiring line portion having a line/space width of 0.05 to 5 mm and a height of 1,000 nm was formed 3H on an Si substrate having a diameter of 200 mm, a pattern wafer on which a 2,000 nm thick silicon oxide film was formed by the TEOS-plasma CVD method was prepared.

The pattern wafer was set on a holder to which an adsorption pad for mounting a substrate to be held was adhered, and the holder was placed on a platen having a diameter of 600 mm to which a polishing pad made of a porous urethane resin was adhered with the insulating film surface down, and then the working load was set to 30 kPa.

The platen and the wafer were rotated for 1 minute at a rotational speed of 50 $min^{-1}$ while dropping the above-mentioned cerium oxide slurry (solid content: 1% by weight) on the platen at a dropping speed of 200 ml/min, thereby polishing the insulating film. After the polished wafer was washed well with pure water, it was dried. Similarly, the above-mentioned pattern wafers were polished by setting the polishing times to 1.5 minutes and 2 minutes.

Polishing speed of a line portion having a line/space width of 1 mm is defined as $R_1$, the polishing speed of a line portion having a line/space width of 3 mm as $R_3$, and the polishing speed of a line portion having a line/space width of 5 mm as $R_5$. The polishing speed ratios $R_5/R_1$ and $R_3/R_1$ became substantially constant between polishing time of 1 and 2 minutes.

In the case of 1.5 minutes polishing time where the pattern width dependency of the polishing speed becomes constant, the polishing speed $R_1$ for a line portion having a line/space width of 1 mm was 811 nm/min (amount of polishing: 1,216 nm), the polishing speed $R_3$ for a line portion having a line/space width of 3 mm was 616 nm/min (amount of polishing: 924 nm), and the polishing speed $R_5$ for a line portion having a line/space width of 5 mm was 497 nm/min (amount of polishing: 746 nm), and the polishing speed ratios $R_5/R_1$ and $R_3/R_1$ were 0.61 and 0.76 respectively. In the polishing time of 2 minutes, polishing advanced to the Al wiring which is a ground under the silicon oxide film in a line portion of the line/space width of 0.05 to 1 mm.

Comparative Example 2

Polishing of Insulating Film

After an Al wiring line portion having a line/space width of 0.05 to 5 mm and a height of 1,000 nm was formed on an Si substrate having a diameter of 20.0 mm, a pattern wafer on which a 2,000 nm thick silicon oxide film was formed by the TEOS-plasma CVD method was prepared.

2 minutes polishing was performed using a commercially available silica slurry in the same manner as in the above-mentioned Examples. The pH of this commercially available silica slurry is 10.3 and the slurry contains 12.5% by weight of $SiO_2$ particles. The polishing conditions were set to the same as in Example 1. As in the case of Example 1, the above-mentioned pattern wafers were polished by setting the polishing time to 3 minutes, 4 minutes, 5 minutes, and 6 minutes.

Using an optical interference type film thickness measuring device, the thickness difference before and after polishing was measured and the polishing speed was calculated. The polishing speed of a line portion having a line/space width of 1 mm is defined as $R_1$, the polishing speed of a line portion having a line/space width of 3 mm as $R_3$, and the polishing speed of a line portion having a line/space width of 5 mm as $R_5$. The polishing speed ratios $R_5/R_1$ and $R_3/R_1$ became larger between the polishing time of 2 and 5 minutes according to the increase in the polishing time, and became substantially constant between the polishing time of 5 and 6 minutes.

In the case of 5 minutes polishing time where the pattern width dependency of the polishing speed becomes constant, the polishing speed $R_1$ for a line portion having a line/space width of 1 mm was 283 nm/min (amount of polishing: 1,416 nm), the polishing speed $R_3$ for a line portion having a line/space width of 3 mm was 218 nm/min (amount of polishing: 1,092 nm), and the polishing speed $R_5$, for a line portion having a line/space width of 5 mm was 169 nm/min (amount of polishing: 846 nm), and the polishing speed ratios $R_5/R_1$ and $R_3/R_1$ were 0.60 and 0.77, respectively. The polishing speed of line portions in each line/space width for the polishing time of 6 minutes was substantially the same as in the case of 5 minutes, and it was found that the polishing advanced at the same polishing speed after the pattern width dependency of the polishing speed became constant.

INDUSTRIAL APPLICABILITY

The CMP abrasive according to the present invention can polish a surface to be polished such as a silicon oxide insulating film or the like at high speed without causing scratches while attaining high level smoothing, and has an excellent storage stability.

The method for polishing a substrate according to the present invention can polish a surface to be polished at high speed without causing scratches while attaining high level smoothing.

The method for manufacturing a semiconductor device according to the present invention can manufacture a semiconductor device having a high degree of reliability with high productivity and good yield.

The additive for the CMP abrasive according to the present invention can polish a surface of a film to be polished at high speed without causing scratches while attaining high level smoothing, and particularly provide the CMP abrasive with excellent storage stability.

The invention claimed is:

1. A CMP abrasive consisting essentially of cerium oxide particles, a dispersant, water, and, additionally, an organic polymer having an atom or a structure capable of forming a hydrogen bond with a hydroxyl group present on a surface of said film to be polished, wherein the organic polymer is a compound containing at least one atom having an unpaired electron in a molecular structure, and wherein the abrasive is capable of being used in forming shallow trench isolation, and is adapted to polish an inorganic insulating film having unevenness on a surface thereof.

2. The CMP abrasive according to claim 1, wherein said organic polymer is a compound containing either one or both of a nitrogen atom and an oxygen atom in a molecular structure.

3. The CMP abrasive according to claim 1, wherein said organic polymer is a compound having an adsorption ratio of 50% or more with respect to silicon oxide particles of a specific surface area of 50 $m^2$/g dispersed in water of pH 6 to 8.

4. The CMP abrasive according to claim 1, wherein said organic polymer is a compound having an adsorption ratio of 40% or more with respect to silicon nitride particles of a specific surface area of 3.3 $m^2$/g dispersed in water of pH 6 to 8.

5. The CMP abrasive according to claim 1, wherein the sedimentation speed of the cerium oxide particles is 20 μm/s or less.

6. The CMP abrasive according to claim 1, wherein said organic polymer is polyvinyl pyrrolidone.

7. The CMP abrasive according to claim 6, wherein said polyvinyl pyrrolidone has a weight average molecular weight of 5,000 to 1,200,000.

8. The CMP abrasive according to claim 1, which comprises 0.01 to 2.0 parts by weight of a dispersant and 0.001 to 1,000 parts by weight of an organic polymer based on the cerium oxide particle of 100 parts by weight, and the rest comprising water, the concentration of the cerium oxide particles in the abrasive being 0.5 to 20% by weight.

9. A method for polishing a substrate comprising polishing by moving a substrate on which an inorganic insulating film having unevenness on a surface thereof, to be polished is formed and a polishing platen while pressing the substrate against the polishing platen and a polishing cloth and supplying said CMP abrasive for polishing the inorganic insulating film having unevenness on a surface thereof according to claim 1, between the inorganic insulating film to be polished and the polishing cloth.

10. A method for manufacturing a semiconductor device comprising a step of polishing an inorganic insulating film having unevenness on a surface thereof, to be polished, by moving a substrate on which the film to be polished is formed and a polishing platen while pressing the substrate against the polishing platen and a polishing cloth and supplying said CMP abrasive for polishing an inorganic insulating film having unevenness on a surface thereof according to claim 1, between the inorganic insulating film to be polished and the polishing cloth.

11. The CMP abrasive according to claim 1, wherein said dispersant is selected from the group consisting of water-soluble anionic dispersants, water-soluble nonionic dispersants, water-soluble cationic dispersants and water-soluble amphoteric dispersants.

12. The CMP abrasive according to claim 1, wherein said organic polymer is included in an amount of 0.01 part by weight to 100 parts by weight, based on 100 parts by weight of cerium oxide particles.

13. The CMP abrasive according to claim 1, consisting of the cerium oxide particles, the dispersant, water and the organic polymer.

14. The CMP abrasive according to claim 1, wherein the cerium oxide particles have an average particle diameter of 0.01 μm to 1.0 μm.

15. The CMP abrasive according to claim 1, wherein said organic polymer is selected from the group consisting of poly (meth) acrylic acid ammonium salts.

16. The CMP abrasive according to claim 1, wherein said organic polymer is selected from the group consisting of poly (meth) acrylic acid derivatives.

17. The CMP abrasive according to claim 1, wherein said CMP abrasive is adapted to polish an oxide insulating film having unevenness on a surface thereof.

18. The CMP abrasive according to claim 17, wherein said CMP abrasive is adapted to polish a silicon oxide insulating film having unevenness on a surface thereof.

19. The CMP abrasive according to claim 1, wherein said CMP abrasive is adapted to polish a silicon oxide film having unevenness on a surface thereof.

* * * * *